(12) United States Patent
Nakaya et al.

(10) Patent No.: US 11,060,190 B2
(45) Date of Patent: Jul. 13, 2021

(54) SUBSTRATE PROCESSING APPARATUS AND CONTROL SYSTEM

(71) Applicant: KOKUSAI ELECTRIC CORPORATION, Tokyo (JP)

(72) Inventors: Kazuo Nakaya, Toyama (JP); Hiroki Okamiya, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/362,356

(22) Filed: Mar. 22, 2019

(65) Prior Publication Data

US 2019/0301020 A1 Oct. 3, 2019

(30) Foreign Application Priority Data

Mar. 29, 2018 (JP) .............................. JP2018-064191
Jan. 28, 2019 (JP) .............................. JP2019-011910

(51) Int. Cl.
*C23C 16/52* (2006.01)
*H01L 21/66* (2006.01)
(Continued)

(52) U.S. Cl.
CPC .......... *C23C 16/52* (2013.01); *H01L 21/0228* (2013.01); *H01L 21/67253* (2013.01);
(Continued)

(58) Field of Classification Search
None
See application file for complete search history.

(56) References Cited

U.S. PATENT DOCUMENTS

| 10,211,110 B1* | 2/2019 | Kamakura | ............. H01L 21/02 |
| 2012/0073672 A1* | 3/2012 | Ding | ..................... H01L 21/306 |
| | | | 137/14 |

(Continued)

FOREIGN PATENT DOCUMENTS

| JP | 11-193464 A | 7/1999 |
| JP | 2010-140982 A | 6/2010 |

(Continued)

OTHER PUBLICATIONS

Korean Office Action dated Jun. 16, 2020 for the Korean Patent Application No. 10-02019-0018327.

*Primary Examiner* — Nilufa Rahim
(74) *Attorney, Agent, or Firm* — Volpe Koenig

(57) ABSTRACT

A controller that processes a substrate by executing a process recipe for supplying at least a source gas to a process chamber to form a film on the substrate, and a pressure controller that controls the degree of opening of a pressure control valve on the basis of a pressure value detected by a pressure sensor that detects a pressure in a furnace during execution of the recipe and maintains the process chamber to a predetermined pressure. The pressure controller includes a memory that accumulates data acquired from the pressure sensor and pressure control valve, and measures a valve full close time to full close of the pressure control valve during execution of the process recipe and holds the valve full close time in the memory, and the controller acquires the stored valve full close time and confirms whether the acquired valve full close time falls within a threshold range.

14 Claims, 8 Drawing Sheets

(51) Int. Cl.
*H01L 21/02* (2006.01)
*H01L 21/67* (2006.01)
H01L 21/673 (2006.01)
H01L 21/677 (2006.01)

(52) U.S. Cl.
CPC .......... *H01L 22/10* (2013.01); *H01L 21/6735* (2013.01); *H01L 21/67303* (2013.01); *H01L 21/67766* (2013.01); *H01L 21/67772* (2013.01); *H01L 21/67775* (2013.01); *H01L 21/67781* (2013.01)

(56) References Cited

U.S. PATENT DOCUMENTS

| | | | |
|---|---|---|---|
| 2015/0228474 A1* | 8/2015 | Hanashima | H01L 21/02 |
| 2018/0269055 A1* | 9/2018 | Hashimoto | H01L 21/02 |
| 2019/0316257 A1* | 10/2019 | Iizuka | C23C 16/52 |

FOREIGN PATENT DOCUMENTS

| | | |
|---|---|---|
| JP | 2012-059997 A | 3/2012 |
| KR | 20110076777 A | 7/2011 |
| KR | 20170113669 A | 10/2017 |

\* cited by examiner

SUBSTRATE PROCESSING APPARATUS AND CONTROL SYSTEM

CROSS-REFERENCE TO RELATED PATENT APPLICATION

This application is based upon and claims the benefit of priority from Japanese Patent Application No. 2018-064191, filed on Mar. 29, 2018, and Japanese Patent Application No. 2019-011910, filed on Jan. 28, 2019, the entire contents of which are incorporated herein by reference.

TECHNICAL FIELD

This present disclosure relates to a substrate processing apparatus, a control system, and a method of manufacturing a semiconductor device.

BACKGROUND

Conventionally, as a method of confirming an abnormal state of a pressure control valve, there are a pressure deviation check for confirming follow-up of a pressure monitor at the time of pressure control and a deviation check on the degree of valve opening at the time of control of the degree of valve opening.

In the present circumstances, in a film type that requires a pressure control valve to be opened and closed in a short time to perform pressure control, for example, in a process of forming a film on a substrate such as a semiconductor wafer by alternately supplying a first processing gas (source gas) and a second processing gas (reactant gas) on the substrate, as described in Japanese Patent Application No. 2014-506299, a pressure value is not controlled to a target value, and thus the above-described abnormality check by pressure deviation cannot be applied. Further, the abnormality detection by deviation check of the degree of valve opening is possible but an accurate time from an open state to a close state of the pressure control valve cannot be obtained even if the abnormality is detected.

Further, in a case of recognizing a close time of the pressure control valve by a process control module via a current communication line, a delay time due to the communication line exists as in the comparative example illustrated in FIG. 6, and a time difference from the actual close time of the pressure control valve occurs and the accurate close time cannot be acquired.

SUMMARY

In view of such circumstances, this present disclosure provides a configuration to acquire an accurate close time of a pressure control valve.

According to an aspect of this present disclosure, provided is a configuration including a controller that processes a substrate by executing a process recipe for supplying at least a source gas to a process chamber to form a film on the substrate, and a pressure control controller that controls the degree of opening of a pressure control valve on the basis of a pressure value detected by a pressure sensor that detects a pressure in a furnace during execution of the recipe and maintains the process chamber to a predetermined pressure, and the configuration in which the pressure control controller includes a memory region in which data acquired from the pressure sensor and the pressure control valve is accumulated, and measures a valve full close time to full close of the pressure control valve during execution of the process recipe and holds the valve full close time in the memory region, and the controller acquires the valve full close time held in the memory region and confirms whether the acquired valve full close time falls within a threshold range.

DETAILED DESCRIPTION (1) Outline of Substrate Processing Apparatus

In a substrate processing apparatus described in the present embodiments is used in a process of manufacturing a semiconductor device, and heats a substrate to be processed with a heater in a state where the substrate is accommodated in a process chamber and applies processing.

An example of the substrate to be processed by the substrate processing apparatus includes a semiconductor wafer substrate (hereinafter simply referred to as "wafer") on which a semiconductor integrated circuit device (semiconductor device) is built. Further, examples of the processing performed by the substrate processing apparatus include oxidizing, diffusion processing, reflow and annealing for carrier activation and planarization after ion implantation, and film formation processing by thermal chemical vapor deposition (CVD) reaction.

(2) Schematic Configuration of Substrate Processing Apparatus

Figure 1:
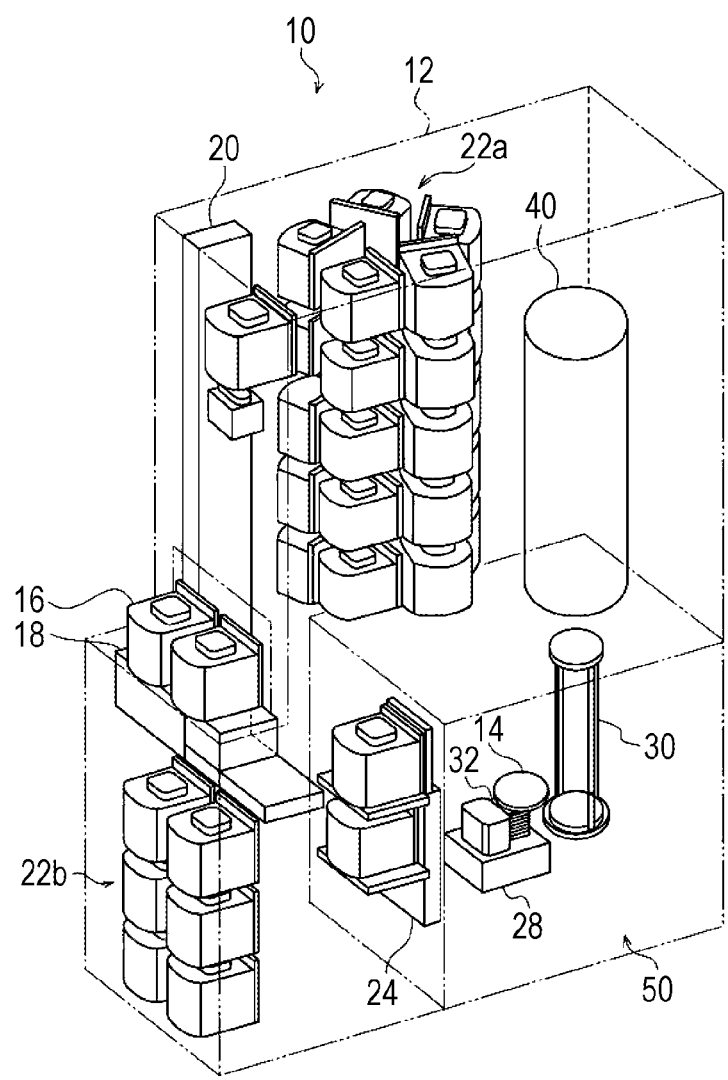
FIG. 1 is a perspective view illustrating a configuration example of a substrate processing apparatus according to embodiments of this present disclosure.

A configuration example of the substrate processing apparatus according to the present embodiments will be described with reference to FIG. 1.

(Overall Apparatus)

A substrate processing apparatus 10 includes a housing 12 in which main parts such as a process furnace 40 are arranged. A pod stage 18 is arranged on a front side of the housing 12. A pod 16 as a transfer container for accommodating a wafer 14 is transferred and placed on the pod stage 18. The pod 16 has twenty-five wafers 14 accommodated therein, for example, and is configured to be placed on the pod stage 18 in a state where a lid (not illustrated) is closed. In other words, the substrate processing apparatus 10 exchanges the pod 16 with an external device while using the pod stage 18 on which the pod 16 is to be placed.

A pod transfer device 20 that transfers the pod 16 is arranged at a position on the front side in the housing 12 and facing the pod stage 18. A rotary pod shelf 22a capable of storing the pod 16, a stacked pod shelf 22b capable of storing the pod 16, and a pod opener 24 are arranged near the pod transfer device 20. The pod transfer device 20 is configured to transfer the pod 16 among the pod stage 18, the rotary pod shelf 22a, the stacked pod shelf 22b, and the pod opener 24.

The rotary pod shelf 22a is arranged in a first shelf region that is a region above the pod opener 24 and is configured to hold a plurality of the pods 16 in a placed state. The rotary pod shelf 22a is configured by a rotary shelf having a plurality of stages (for example, five stages) of shelf plates. Further, a clean unit including a supply fan and a dustproof filter may be provided near the rotary pod shelf 22a, and clean air as a cleaned atmosphere may be circulated from the clean unit.

The stacked pod shelf 22b is arranged in a second shelf region that is a region below the pod stage 18 and is configured to hold a plurality of the pods 16 in a placed state. The stacked pod shelf 22b has a plurality of stages (for example, three stages) of shelf plates and is configured to have the pods 16 placed on the respective shelf plates. Further, clean air may be circulated near the stacked pod shelf 22b, similarly to the rotary pod shelf 22a.

The pod opener 24 is configured to open the lid of the pod 16. Note that a substrate number detector that detects the number of the wafers 14 in the pod 16 with the lid opened may be arranged adjacent to the pod opener 24.

A transfer chamber 50 partitioned as one room in the housing 12 is formed on a back side of the pod opener 24 in the housing 12. A substrate transfer machine 28 and a boat 30 as a substrate holder are arranged in the transfer chamber 50.

The substrate transfer machine 28 has an arm (tweezer) 32 capable of taking out five wafers 14, for example. The substrate transfer machine 28 is configured to be able to transfer the wafer 14 between the pod 16 placed at the position of the pod opener 24 and the boat 30 by rotating and moving the arm 32 up and down by driving means (not illustrated).

The boat 30 is configured to align and stack a plurality of wafers 14 (about 50 to 175 wafers 14, for example) in a horizontal attitude with centers aligned at predetermined intervals in a vertical direction, and hold the plurality of wafers 14 in multistage in a longitudinal direction. The boat 30 holding the wafers 14 is configured to be able to move up and down by a boat elevator as an elevating mechanism (not illustrated).

The process furnace 40 is arranged in a back-side upper portion in the housing 12, that is, above the transfer chamber 50. The boat 30 loaded with the plurality of wafers 14 is carried into the process furnace 40 from below.

(Process Furnace)

Figure 2:
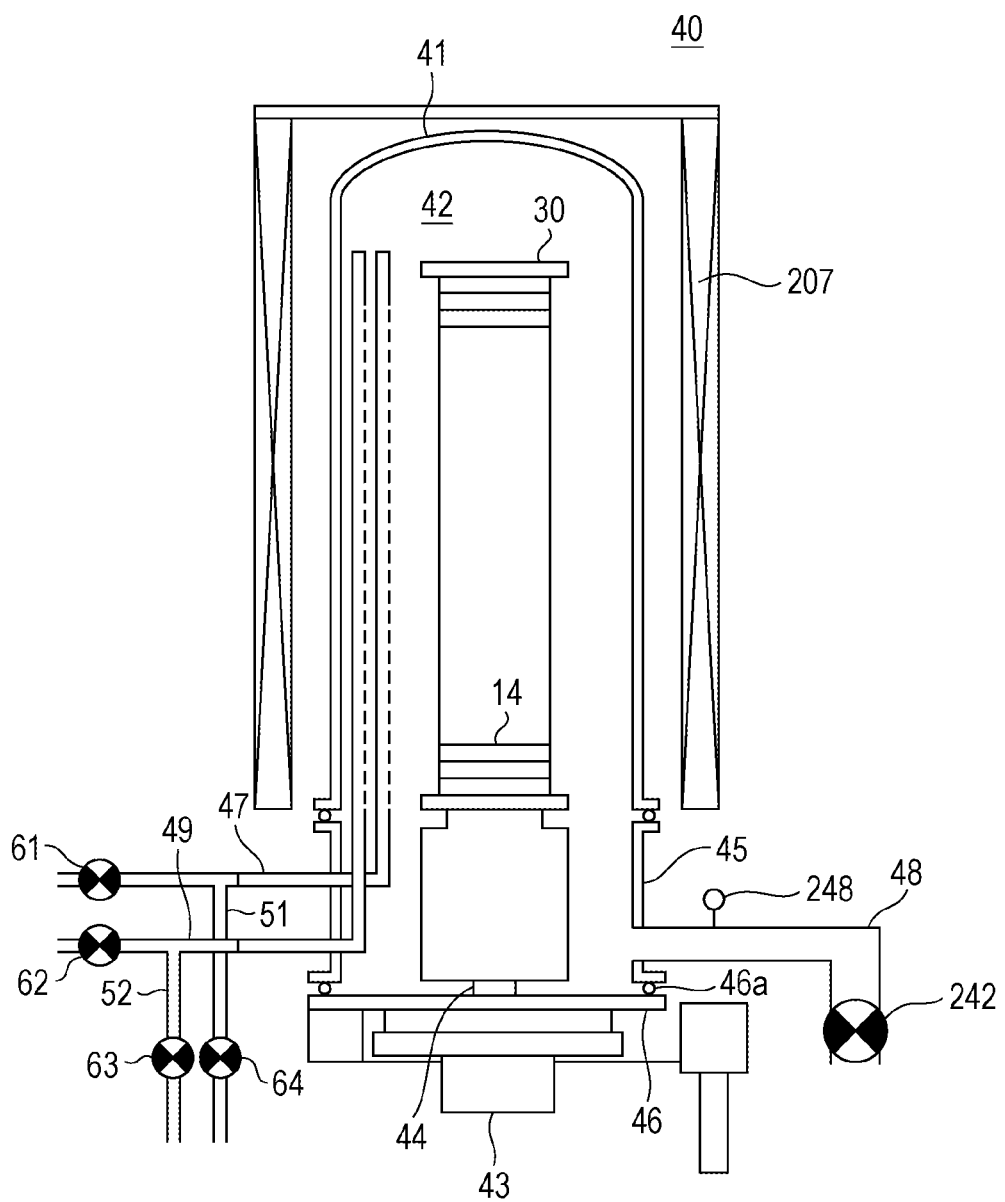
FIG. 2 is a longitudinal sectional view illustrating a configuration example of a processing furnace used in the substrate processing apparatus according to the embodiments of this present disclosure.

Next, the above-described process furnace 40 will be briefly described with reference to FIG. 2.

The process furnace 40 is provided with a reaction tube 41. The reaction tube 41 is configured by a heat-resistant non-metallic material such as quartz (SiO2) or silicon carbide (SiC) and is formed in a cylindrical shape with an upper end closed and a lower end opened.

A process chamber 42 is formed in the cylinder of the reaction tube 41. The process chamber 42 is configured such that the boat 30 as a substrate holder is inserted from below, and the wafers 14 held in the horizontal attitude by the boat 30 are accommodated in an aligned state in multistage in the vertical direction. The boat 30 accommodated in the process chamber 42 is configured to be rotatable in a state where the plurality of wafers 14 is mounted while keeping airtightness of the process chamber 42 by rotating a rotation shaft 44 by a rotation mechanism 43.

A manifold 45 is arranged below the reaction tube 41 concentrically with the reaction tube 41. The manifold 45 is configured by a metallic material such as stainless steel, for example, and has a cylindrical shape with an upper end and a lower end opened. The reaction tube 41 is longitudinally supported from a lower end side with this manifold 45. That is, the reaction tube 41 forming the process chamber 42 stands in the longitudinal direction via the manifold 45 to constitute the process furnace 40.

A lower end of the manifold 45 is configured to be airtightly sealed by a seal cap 46 when a boat elevator (not illustrated) rises. A sealing member 46a such as an O ring for airtightly sealing an interior of the process chamber 42 is provided between the lower end of the manifold 45 and the seal cap 46.

Further, a first gas supply pipe 47 having a valve 61 for introducing a source gas into the process chamber 42, a second gas supply pipe 49 having a valve 62 for introducing a reactant gas into the process chamber 42, and an exhaust pipe 48 for exhausting a gas in the process chamber 42 are connected to the manifold 45.

A first purge gas introduction pipe 51 having a valve 64 for introducing a purge gas or the like is connected to the first gas supply pipe, and a second purge gas introduction pipe 52 having a valve 63 for introducing a purge gas or the like is connected to the second gas supply pipe.

The exhaust pipe 48 is provided with a pressure sensor 248 as a pressure detector that detects a pressure in the process chamber 42 and an auto pressure control (APC) valve 242 as a pressure control valve that adjusts the pressure in the process chamber 42.

A heater unit 207 as heating means (heating mechanism) is arranged concentrically with the reaction tube 41 on an outer periphery of the reaction tube 41. The heater unit 207 is configured to heat the interior of the process chamber 42 so that the interior of the process chamber 42 has uniform or predetermined temperature distribution.

(3) Outline of Substrate Processing Process

Next, an operation procedure in a case of performing processing for the wafer 14 as one process of semiconductor device manufacturing using the substrate processing apparatus 10 according to the present embodiments will be described.

(Pod Transfer Process)

In a case where the substrate processing apparatus 10 performs processing for the wafer 14, first, the substrate processing apparatus 10 places the pod 16 accommodating a plurality of the wafers 14 on the pod stage 18. Then, the pod transfer device 20 transfers the pod 16 from the pod stage 18 to the rotary pod shelf 22a or the stacked pod shelf 22b.

(Wafer Supply Process)

Thereafter, the pod transfer device 20 transfers the pod 16 placed on the rotary pod shelf 22a or the stacked pod shelf 22b to the pod opener 24. Then, the pod opener 24 opens the lid of the pod 16 and the substrate number detector detects the number of the wafers 14 accommodated in the pod 16.

(Pre-Loading Transfer Process)

When the pod opener 24 opens the lid of the pod 16, next, the substrate transfer machine 28 arranged in the transfer chamber 50 takes out the wafer 14 from the pod 16. Then, the substrate transfer machine 28 transfers the unprocessed wafer 14 taken out from the pod 16 to the boat 30 located in the transfer chamber 50 as in the substrate transfer machine 28. That is, the substrate transfer machine 28 performs a wafer charge operation of charging the unprocessed wafer 14 into the boat 30 before being loaded into the process chamber 42 in the transfer chamber 50. By the wafer charge operation, the boat 30 holds the plurality of wafers 14 in a stacked state at intervals in the vertical direction. The number of wafers 14 that the boat 30 holds in a stacked state and collectively processes is, for example, 50 to 175.

(Loading Process)

After the wafer charge operation, the boat 30 holding the plurality of unprocessed wafers 14 is loaded into the process chamber 42 (boat loading) by a lifting and lowering operation of the boat elevator. That is, the boat 30 holding the unprocessed wafers 14 is loaded from the transfer chamber 50 into the process chamber 42 by operating the boat elevator. By the boat loading, the seal cap 46 is in a state of sealing the lower end of the manifold 45 via the sealing member 46a.

(Processing Process)

After the boat loading, predetermined processing is performed for the unprocessed wafers 14 held by the boat 30 loaded into the process chamber 42. For example, in the case of performing the film formation processing, the interior of the process chamber 42 is heated using the heater unit 207, and the rotation mechanism 43 is operated to rotate the wafer 14 while rotating the boat 30. The rotation of the wafer 14 continues until unloading of the wafer 14 to be described below. Then, the source gas, the purge gas, and the like are supplied to the process chamber 42 through the first gas supply pipe 47. As a result, a thin film is formed on a surface of the unprocessed wafer 14 held by the boat 30.

After the formation of the thin film on the surface of the wafer 14, the heating by the heater unit 207 is stopped, and the temperature of the processed wafer 14 is lowered to a predetermined temperature. Then, when a preset time has elapsed, the supply of the gas into the process chamber 42 is stopped, and supply of an inert gas to the process chamber 42 is started. As a result, the process chamber 42 is replaced with the inert gas and the pressure in the process chamber 42 is restored to normal pressure.

(Unloading Process)

Thereafter, the boat elevator lifts and lowers the seal cap 46 to open the lower end of the manifold 45, and unloads the boat 30 holding the processed wafer 14 from the lower end of the manifold 45 to the outside of the process chamber 42 (boat unloading). That is, the boat elevator is operated to unload the boat 30 holding the processed wafer 14 from the process chamber 42 into the transfer chamber 50.

(Post-Unloading Transfer Process)

After the wafer 14 of the waiting boat 30 is cooled to the predetermined temperature (for example, around room temperature), the substrate transfer machine 28 arranged in the transfer chamber 50 dismounts the wafer 14 from the boat 30. Then, the processed wafer 14 dismounted from the boat 30 is transferred to and accommodated in the empty pod 16 placed at the pod opener 24. That is, the substrate transfer machine 28 performs a wafer discharge operation of taking out, from the boat 30, the processed wafer 14 held by the boat 30 unloaded from the process chamber 42 and transferring the wafer 14 to the pod 16 in the transfer chamber 50.

After that, the pod transfer device 20 transfers the pod 16 accommodating the processed wafers 14 onto the rotary pod shelf 22a, the stacked pod shelf 22b, or the pod stage 18. In this way, the series of processing operations of the substrate processing step by the substrate processing apparatus 10 according to the present embodiments is completed.

Figure 3:
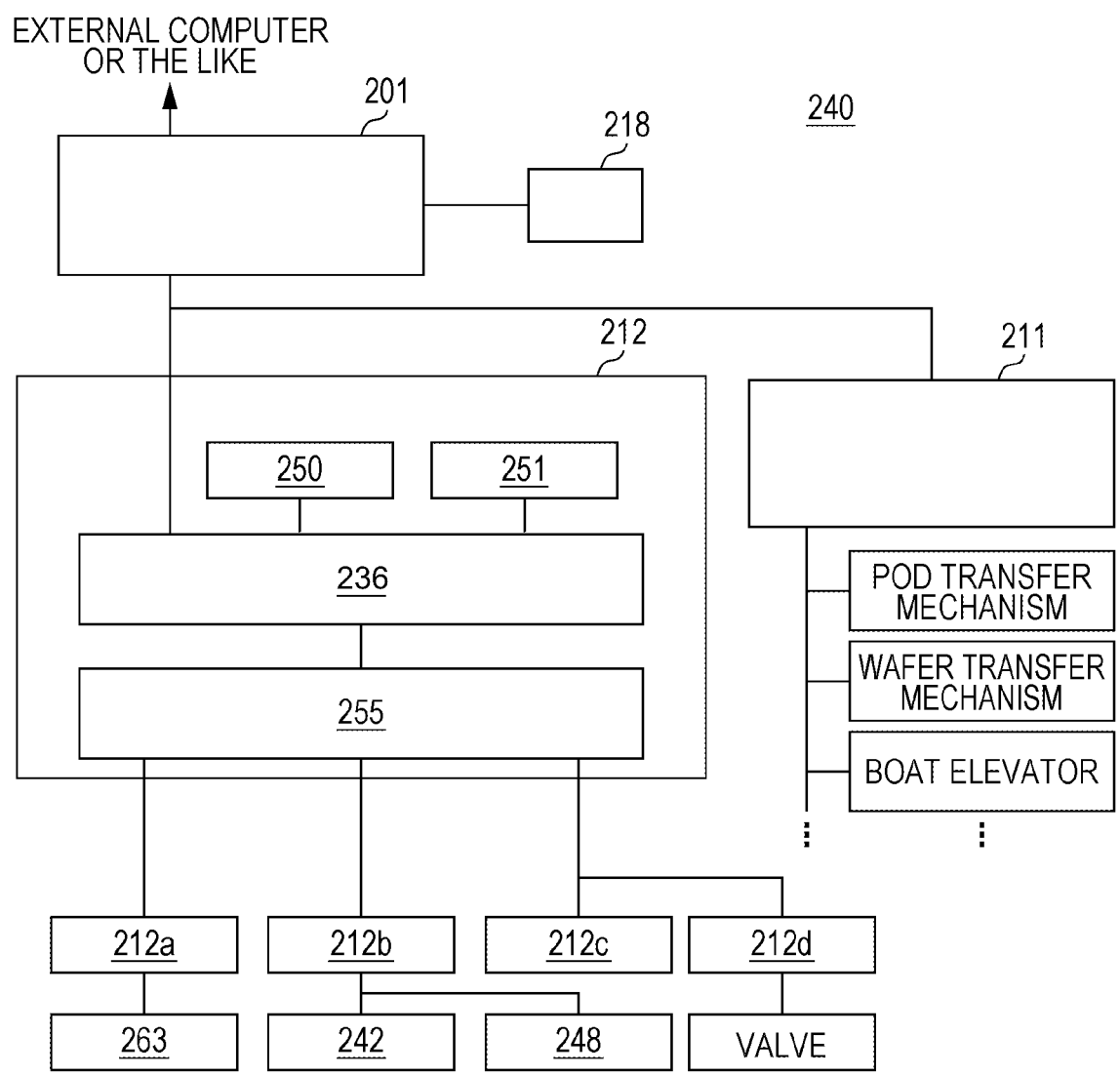
FIG. 3 is a diagram illustrating a configuration of a device controller in the substrate processing apparatus according to this present disclosure.
Figure 4:
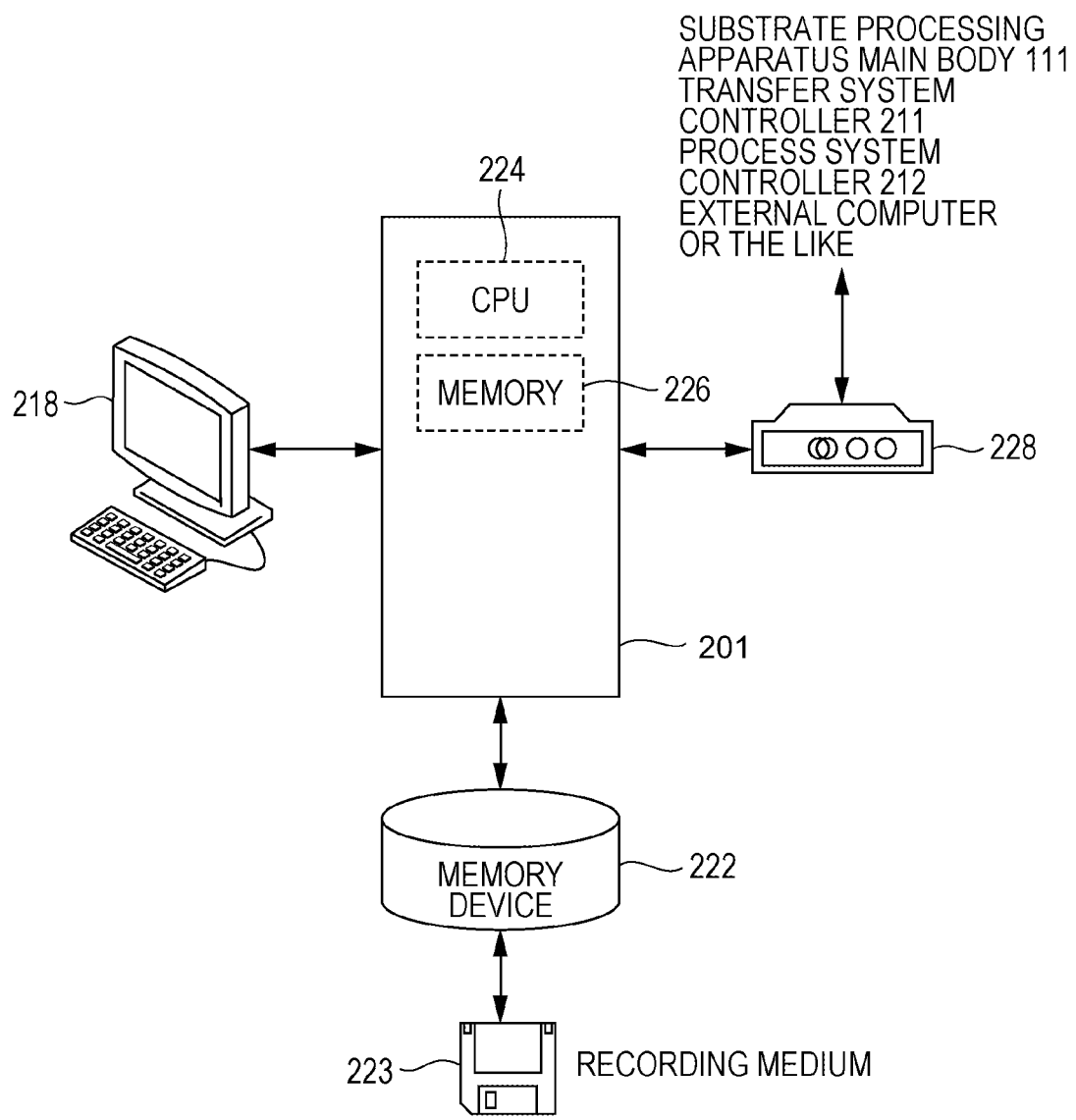
FIG. 4 is a block diagram illustrating a configuration of a main controller in the substrate processing apparatus according to this present disclosure.

A control device 240 that controls transfer mechanisms respectively including the pod transfer device 20, the substrate transfer machine 28, and the boat elevator, which are mechanisms that transfer at least the wafer 14, a gas supply mechanism that supplies the processing gas and the like to the process furnace 40, a gas exhaust mechanism that evacuates the interior of the process furnace 40, and the heating mechanism 207 that heats the process furnace 40 to the predetermined temperature will be described with reference to FIGS. 3 and 4.

As illustrated in FIG. 3, the device controller 240 as a control device includes a main controller 201, a transfer system controller 211 as a transfer control module, and a process system controller 212 as a process control module. The transfer system controller 211 and the process system controller 212 are electrically connected to the main controller 201 by, for example, a local area network (LAN) such as 100BASE-T. The main controller 201 is connected to an external host computer (not illustrated) via a communication network, for example.

Operation screens for operating a substrate processing apparatus 10 are configured to be displayed on a display device 218. Further, the display device 218 receives input data (input instruction) of an operator from the operation screen and transmits the input data to the main controller 201.

Further, the display device 218 receives an instruction (control instruction) for executing a recipe expanded on a memory (RAM) described below or the like or an arbitrary substrate processing recipe (also referred to as process recipe) out of a plurality of recipes stored in a storage described below from the operation screen, and transmits the received recipe to the main controller 201. Note that the operation screen of the display device 218 may be configured by a touch panel. In the present embodiments, the main controller 201 is configured to execute a process recipe for repeatedly executing a process of supplying a process gas to the process chamber 42 and a process of exhausting the process gas from the process chamber 42. Here, the process recipe includes at least a process of supplying a source gas as a first process gas to the process chamber 42, a process of exhausting the source gas from the process chamber 42, a process of supplying a reactant gas as a second process gas for reacting with the source gas to the process chamber 42, and the process of exhausting the reactant gas from the process chamber 42.

Although partly omitted in FIG. 3, the transfer system controller 211 is connected to a substrate transfer system mainly configured by the rotary pod shelf, the boat elevator, the pod transfer device 20, the substrate transfer machine 28, the boat 30, and the rotation mechanism 43. Further, the transfer system controller 211 is configured to control transfer operations of the substrate transfer system.

The process system controller 212 includes a temperature controller 212a, a pressure controller 212b as a pressure control controller, a gas flowrate controller 212c, and a sequencer 212d, which constitute a sub controller. Since the sub controller is electrically connected to the process system controller 212, transmission and reception of data, downloading and uploading of files, and the like can be performed. Although the process system controller 212 and the sub controller are separately illustrated, the process system controller 212 and the sub controller may be integrally configured.

The heating mechanism 207 mainly configured by a heater and a temperature sensor is connected to the temperature controller 212a. The temperature controller 212a is configured to control the temperature in the process furnace 40 by controlling the temperature of the heater of the processing furnace 40.

The gas exhaust mechanism configured by the pressure sensor 248, the APC valve 242, and a vacuum pump is connected to the pressure controller 212b. The pressure controller 212b is configured to control the degree of opening of the APC valve 242 and switching (on and off) of the vacuum pump such that the pressure in the process chamber 42 becomes a desired pressure at desired timing on the basis of a pressure value detected by the pressure sensor 248. As will be described in detail below, the pressure controller 212b is provided with a memory region for storing various data including opening and closing times of the APC valve 242, and is configured to report (transmit) data in the memory region in response to a data request from the process system controller 212. Note that the memory region stores (holds) latest data of the various data after the data report.

The gas flowrate controller 212c is configured by a mass flow controller (MFC). The sequencer 212d is configured to control supply and stop of the gases from the first gas supply pipe 47 and the second gas supply pipe 49 by opening and closing the valves 61, 62, 63, and 64. Further, the process system controller 212 is configured to control the MFC 212c and the valves 61, 62, 63, and 64 such that a flowrate of the gas to be supplied to the process chamber 42 becomes a desired flowrate at desired timing.

Further, FIG. 3 illustrates details of the process system controller 212. Although not illustrated and described, the transfer system controller 211 has a similar configuration.

Further, as illustrated in FIG. 3, the process system controller 212 includes a CPU 236 as a processor, and includes at least a temporary storage including at least a read-only memory (ROM) 250 and a random-access memory (RAM) 251, and an I/O communicator 255 that performs I/O communication with the temperature controller 212a, the MFC 212c, the pressure controller 212b, the sequencer 212d, and the like. The CPU 236 outputs, for example, control data (control instruction) for processing the substrate to the sub controller such as the temperature controller 212a at a predetermined cycle on the basis of the recipe created or edited on the operation screen of the display device 218 or the like and stored in the RAM 251 or the like. Note that a data collection cycle of the process system controller 212 is one second.

The RAM 251 temporarily stores the input data (input instruction) input from the display device 218 and the like, commands of the recipes and history data of at the time of execution of the recipes, for example, monitor data generated from the above-described transfer mechanism or processing mechanism, and the like. These data in the RAM 251 are configured to be uploaded to a storage 222 described below of the main controller 201 at predetermined timing. Further, the ROM 250 may also be used as a storage that stores programs including the above-described process recipe. In this case, the data are downloaded from the storage 222 described below of the main controller 201 according to a storage instruction made on the operation screen displayed on the display device 218 or on an operation screen displayed on an external display device.

Note that the main controller 201, the transfer system controller 211, and the process system controller 212 according to the present embodiments can be realized using an ordinary computer, not by a special system. For example, controllers that execute predetermined processing by installing programs for executing the above-described processing from a record medium storing the programs to a general-purpose computer can be configured.

Then, means for supplying these programs are arbitrary. Besides being able to be supplied via a predetermined recording medium as described above, the programs may be supplied via a communication line, a communication network, a communication system, or the like, for example. In this case, for example, the programs may be posted on a bulletin board of the communication network, and the programs may be provided by being superimposed on carrier waves via the network. Then, the programs provided in this manner are activated and executed similarly to other application programs under control of the OS, whereby the predetermined processing can be executed.

Next, FIG. 4 is a block configuration diagram of the main controller 201 included in the device controller 240 as a control device of the substrate processing apparatus 10 according to the present embodiments.

The main controller 201 as a main controller is configured as a computer including a central processing unit (CPU) 224 as a processor, a memory (RAM, ROM, and the like) 226 as a temporary storage, a hard disk (HDD) 222 as a storage, a transmission reception module 228 as a communicator, and a timer (not illustrated) having a timing function.

The hard disk 222 stores recipe files such as the process recipes in which processing conditions and processing procedures are defined, control program files for executing the recipe files, and the like. In the present embodiments, a program for acquiring various data including opening and closing times of the pressure control valve 242 is executed during execution of the process recipe. The main controller 201 causes the process control module 212 to execute the process recipe, thereby causing the substrate processing apparatus 10 to execute a procedure of processing the substrate. Then, in the procedure of processing the substrate, the main controller 201 causes the process control module 212 to execute a procedure of controlling the degree of opening of the pressure control valve 242 on the basis of a detection value of the pressure sensor 248 that detects the pressure in the processing furnace and maintaining the process chamber 42 to a predetermined pressure, a procedure of holding the data acquired from the pressure sensor 248 and the pressure control valve 242 in the memory region, a procedure of measuring a valve full close time (hereinafter also referred to as close time) to full close of the pressure control valve 242 and storing the close time in the memory region, and a procedure of reporting the close time. Further, the main controller 201 causes the process control module 212 to execute a procedure of confirming whether the close time falls within a predetermined threshold value or threshold range. Here, in the present embodiments, not only a time from full open (the degree of valve opening 100%) to full close (the degree of opening 0%) but also a time required to the full close (the degree of valve opening 0%) based on a valve close signal of the process control module 212 is defined as the close time.

Here, a switching hub or the like is connected to the transmission reception module 228 of the main controller 201, and the main controller 201 is configured to transmit and receive data to and from an external computer or the like via a network. Therefore, even in a case where the substrate processing apparatus 10 is installed in a clean room, for example, a host controller connected to a plurality of the main controllers 201 in a data exchangeable manner as an external computer can be installed in an office or the like outside the clean room. Note that the external computer located at a separated position and connected to the substrate processing apparatus 10 is not limited to the host controller and may be an ordinary general-purpose computer so-called personal computer (PC) or may be a dedicated terminal.

Note that, as illustrated in FIG. 4, the main controller 201 may include a user interface (UI) device 218 including a display device such as a liquid crystal display and pointing devices such as a keyboard and a mouse.

Figure 5:
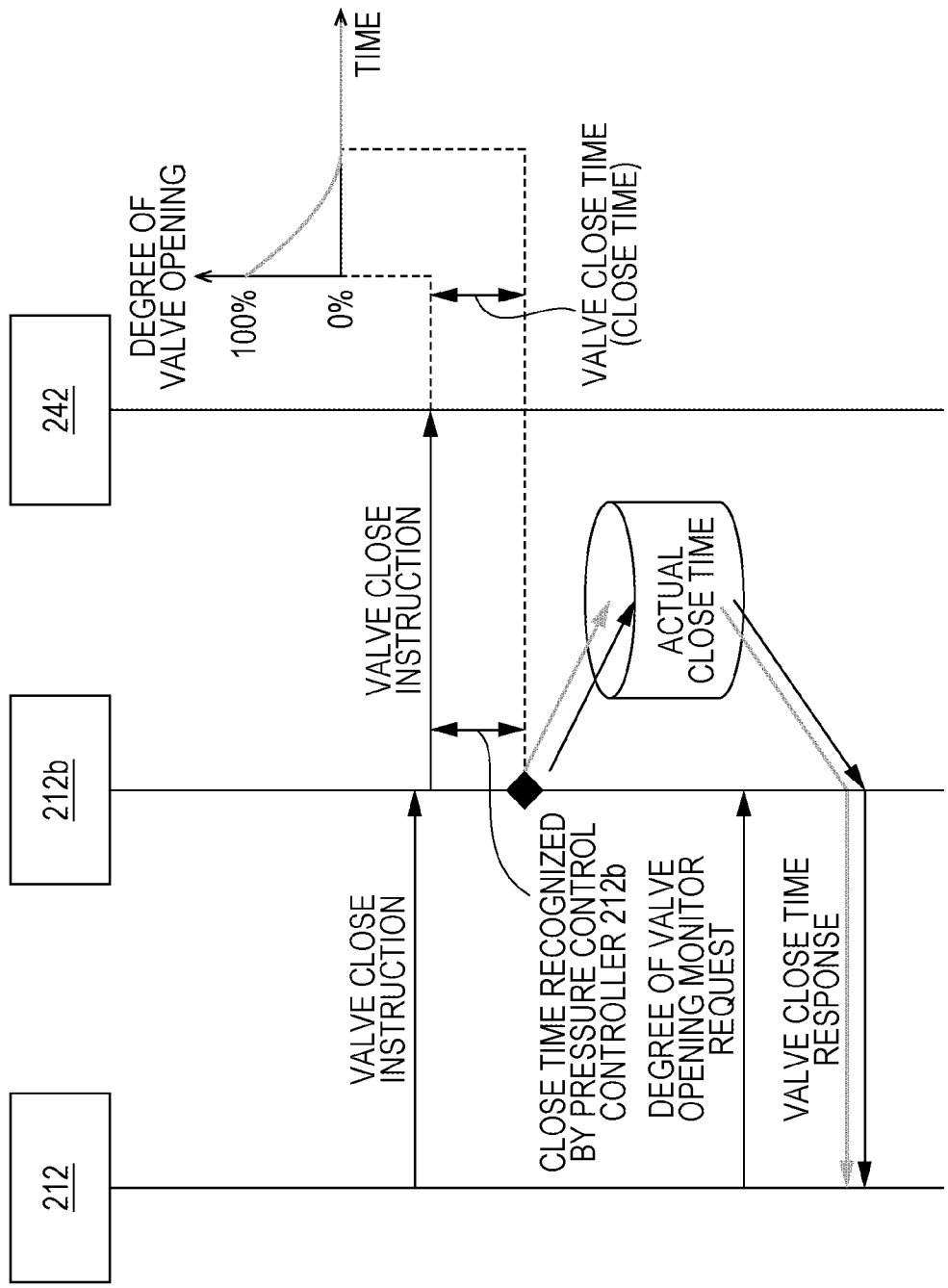
FIG. 5 is a diagram illustrating a communication system configuration according to embodiments of this present disclosure.

As illustrated in FIG. 5, according to the present embodiments, the process control module 212 that processes the substrate by executing the process recipe, and the pressure control controller 212b that controls the degree of opening of the pressure control valve 242 on the basis of the detection value of the pressure sensor 248 that detects the pressure in the process furnace 40 during execution of the process recipe and maintains the process chamber 42 to the predetermined pressure are provided, and the pressure control controller 212b includes the memory region as a storage that holds the various data acquired from the pressure sensor 248 and the pressure control valve 242, and is configured to measure the close time to full close of the pressure control valve 242, hold the full close time in the memory region, and report the close time in response to the request instruction from the process control module 212. Then, the process control module 212 is configured to compare the acquired close time with the predetermined threshold value (or the threshold range) and detect an operation abnormality of the pressure control valve 242. Further, the various data in the memory region is configured such that latest data of the various data is stored after the report of the data such as the close time to the process control module 212.

The valve close signal (instruction to fully close the valve) is output from the process control module 212 to the pressure control module 212b, and the pressure control module 212b fully closes (full close) the pressure control valve 242 in response to the instruction. Then, since the pressure control module 212b measures the data of the degree of valve opening of the pressure control valve 242 from the pressure control valve 242 at a shorter cycle than the process control module 212, the pressure control module 212b can acquire an accurate close time to full close. Specifically, the data collection cycle of the pressure control module 212b is 0.01 seconds and can collect detailed data, as compared with the cycle (one second) of the process control module 212.

The pressure control controller 212b constantly stores the data of the degree of valve opening of the pressure control valve 242 in the memory region until the degree of valve opening becomes 0%, and stores all the data of the degree of valve opening in the memory region. Further, the pressure control controller 212b measures the time (close time) to when the degree of valve opening becomes 0%, and stores time data of the close time in the memory region. Needless to say, in a case where the memory region is small, it is not necessary to store all the data of the degree of valve opening. Then, the pressure control controller 212b stands by until a degree of valve opening monitor request instruction is given from the process control module 212.

Note that the valve full close time held in the memory region by the pressure control controller 212b is held until the next full close operation based on the valve full close time from the process control module 212 is given.

The process control module 212 is configured to output a data request instruction to the pressure control controller 212b, and the pressure control controller 212b is configured to report the close time together with all the data of the degree of valve opening to the process control module 212 when receiving the data request instruction. Then, the process control module 212 is configured to compare the acquired close time with the predetermined threshold value (or threshold range) and detect the operation abnormality of the pressure control valve 242 according to whether the close time falls within the threshold value (or threshold range). Furthermore, when detecting the operation abnormality, the process control module 212 is configured to notify the main controller 201 of occurrence of the abnormality in the pressure control valve 242 as abnormality information. The data collection cycle of the main controller 201 is one second.

Note that the process control module 212 is configured to hold the latest data of the degree of valve opening and the close time after the report. Although not specifically described, not only data regarding the pressure such as the pressure value (measured value) by the pressure sensor 248 but also data regarding the temperature and the gas flowrate are similarly reported as well as the latest data after the report is held.

Although not illustrated in FIG. 5, since the process control module 212 transmits various data including the acquired close time to the main controller 201, the main controller 201 can similarly acquire the close time measured by the pressure control controller 212b. That is, the main controller 201 can be configured to detect the operation abnormality of the APC valve 242 by comparing the acquired close time with the threshold value and provide notification of occurrence of the abnormality in the pressure control valve 242 as the abnormality information. In addition, the host controller can also be similarly configured to detect the operation abnormality of the APC valve 242.

In the present embodiments, the process control module 212 can acquire the degree of opening data including the close time of the APC valve 242, similarly to the pressure control controller 212b. Further, the process control module 212 can detect the operation abnormality of the APC valve 242 by comparing the acquired close time with the threshold value and transmit the abnormality information of the APC valve 242 to the main controller 201. Therefore, for example, the main controller 201 can monitor the close time of the APC valve 242 and confirm the state of the valve that affects the thickness of film like the APC valve 242.

Further, in the present embodiments, since the process control module 212 acquires the close time measured by the pressure control controller 212b as the time from the open state to the close state of the APC valve, the process control module 212 can detect the abnormality of the APC valve 242 without erroneous determination.

Figure 6:
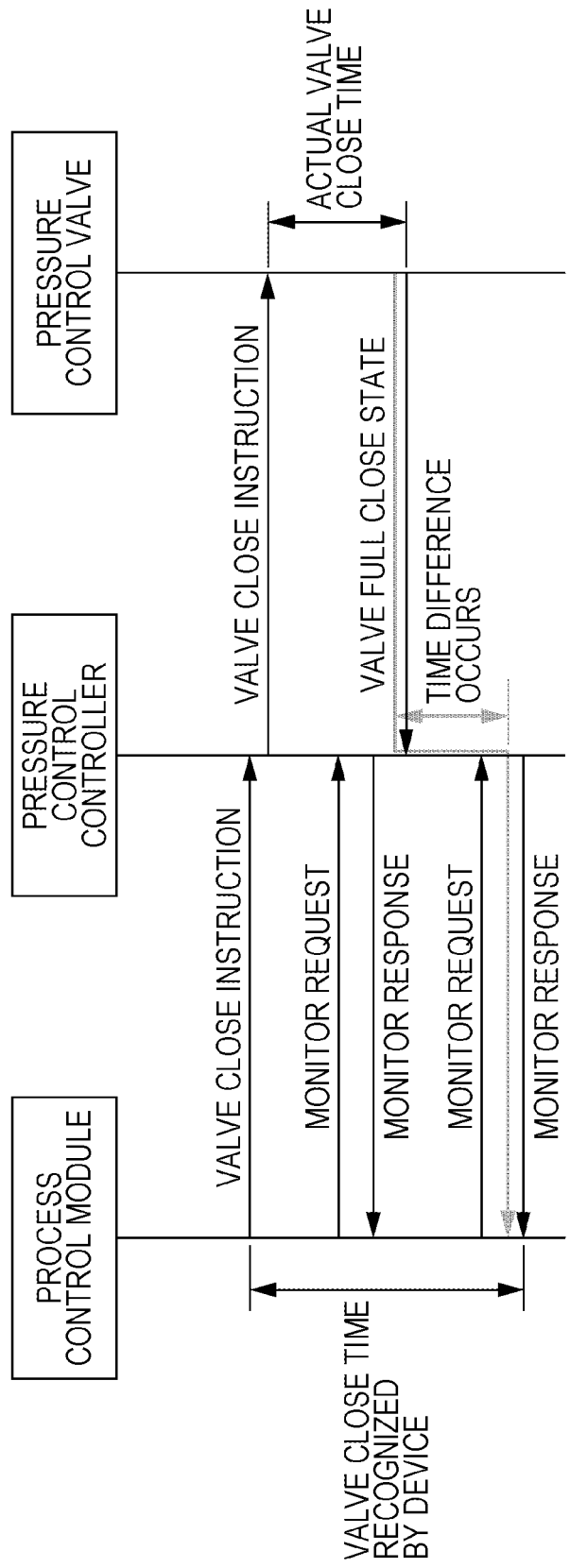
FIG. 6 is a diagram illustrating a communication system configuration according to a comparative example of this present disclosure.

As illustrated in FIG. 6, in a comparative example, when data of the degree of valve opening of 0% is included in data of the degree of valve opening (not including a close time) when a pressure control controller 212b responds to a request instruction from a process control module 212, the process control module 212 determines that an APC valve 242 is fully closed (full close).

Conventionally, the process control module 212 is configured to recognize a period when acquiring the data of the degree of valve opening of 0% as a time when the APC valve 242 is closed. Specifically, since the process control module 212 recognizes the time from when the process control module 212 outputs a valve close instruction to when the pressure control controller 212b responds with the data of the degree of valve opening of 0% as the close time, a time difference from the close time actually acquired by the pressure control controller 212b (actual close time) has occurred.

However, in the present embodiments, the close time acquired by the pressure control controller 212b is held, and the close time is included in response data to the request instruction data of the process control module 212, whereby the process control module 212 can more accurately determine the full close time of the APC valve 242. Further, the process control module 212 can also acquire the time from full open to full close of the APC valve 242, which is the same as the close time acquired by the pressure control controller 212b.

Figure 7:
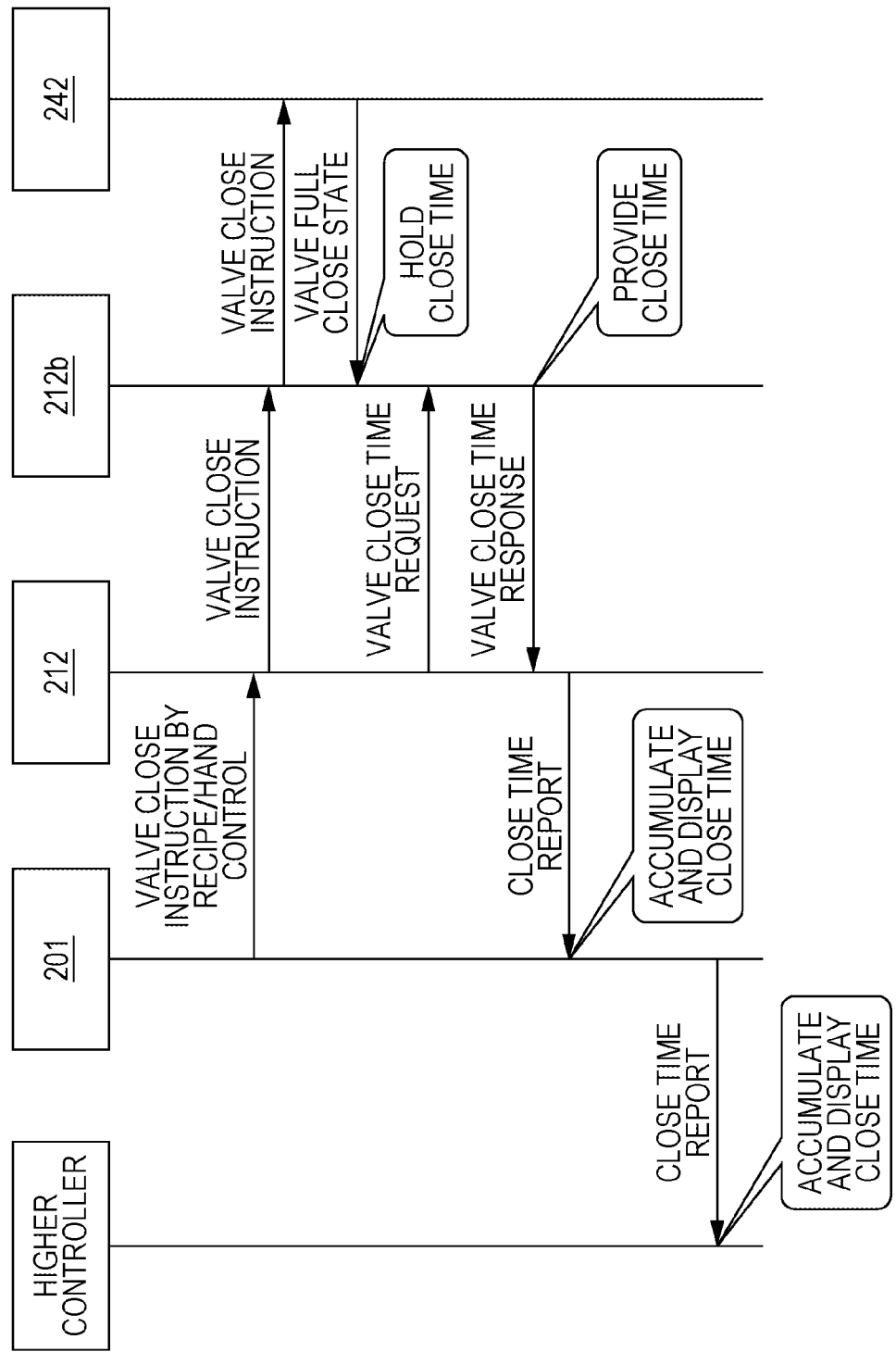
FIG. 7 is a diagram illustrating a communication system configuration in a device controller in the apparatus controller according to this present disclosure.

A communication system configuration of the device controller 240 in the present embodiments will be described with reference to FIG. 7. Here, description of contents that are the same as FIG. 5 is omitted as needed, and here, configurations and contents different from FIG. 5 will be mainly described.

The main control module 201 receives an event set in advance in a step during execution of the process recipe or the valve close instruction from the display device 218, and the main control module 201 outputs a full close (valve close) instruction of the APC valve 242 to the process control module 212. The process control module 212 having received the instruction outputs the full close (valve close) instruction to the pressure control controller 212b. Here, from when the process control module 212 outputs the full close (valve close) instruction to the pressure control controller 212b to when the process control module 212 acquires the close time from the pressure control controller 212b is omitted since it is as explained in FIG. 5. Hereinafter following steps will be described.

The process control module 212 reports the close time obtained from the pressure control controller 212b to the main control module 201. At this time, the pressure value by the pressure sensor 248 and the degree of opening data of the APC valve 242 may also be reported at intervals of one second.

Furthermore, the main control module 201 is configured to report the pressure value by the pressure sensor 248 and the close time and the degree of valve opening data of the APC valve 242 to the host controller connected via the network at intervals of one second.

The host controller or the main control module 201 is configured to accumulate the reported various data and graphically display numerical values of the various data on the screen. For example, by placing the accumulated close time on the vertical axis and displaying the close time in order of execution of the process recipes, changes with time of the APC valve 242 can be confirmed. As a result, wear and deterioration situations of the APC valve 242 can be visually observed.

Further, the host controller or the main controller 201 may be configured to compare the close time with the threshold value, and may be configured to, for example, detect the operation abnormality of the APC valve 242 by comparing the acquired close time with the threshold value, and display the abnormality information of the APC valve 242 on the display device 218.

Figure 8:
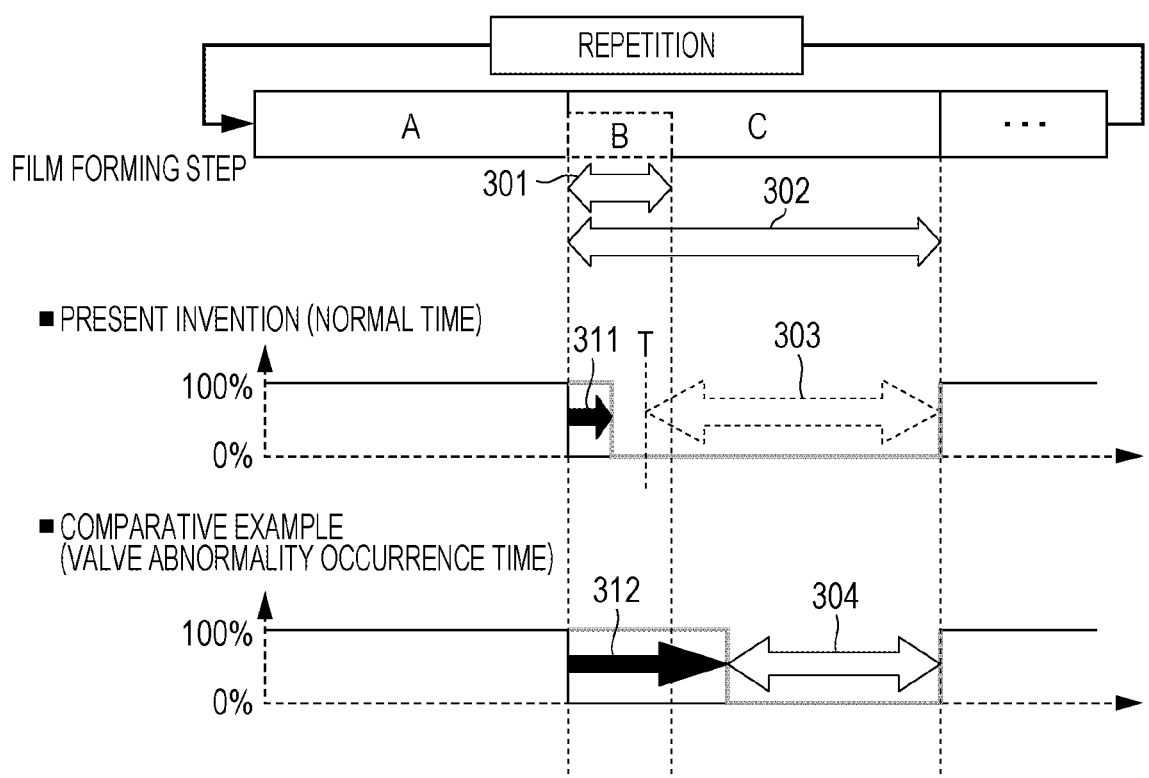
FIG. 8 is a diagram illustrating a relationship between a process recipe and a valve full close time according to embodiments of this present disclosure.

The film forming step of the process recipe is illustrated in a simplified configuration on the upper side in FIG. 8. Process A is a process of purging the process furnace 40 (or process chamber 42) (also referred to as N2 gas flow process of supplying an N2 gas as an inert gas), and process B included in process C described below is a process of fully closing the APC valve 242 and step time 301 is one second.

Process C is a process of supplying the process gas (for example, the source gas), and step time 302 is about several seconds. Then, at least process A and process C (including the process B) repeat the processes as one cycle is disclosed. A configuration in which process B is provided between process A and process C, and process A→process B→process C is repeated as one cycle may be adopted. Note that process C is set to about 2 to 5 seconds, particularly preferably 2 seconds.

The horizontal axis of FIG. 8 is time, and time relevancy between the degree of opening data (unit: %) indicating open and close states of the APC valve 242 at the time of both of normal time and occurrence of valve abnormality and process B below the upper film forming step configuration of the process recipe. At the normal time, close time 311 ends within the step time 301 of process B. Here, a time T indicates a threshold value (unit: time) of the close time 311 and is set to a time that does not affect the thickness of film. For example, the arrow 303 illustrated by the dotted line indicates a case where the time T is set to the minimum time for securing a necessary amount of the process gas (source gas) in one cycle.

Here, the point of the present embodiments is that the close time 311 at the normal time falls within the range of the step time (set to one second) 301 of the process B. That is, the point indicates that the data including the close time 311 collected by the pressure control controller 212b can be acquired by the process control module 212 and the main control module 201. Therefore, the threshold value (time) T of the close time 311 can be set to a time as close the close time 311 as possible in a shorter time than the data collection cycle (one second) of the process control module 212 and the main control module 201. Therefore, in the present embodiments it is configured to be able to detect the abnormality of the APC valve 242 during the film forming step.

According to the conventional valve abnormality occurrence time illustrated in FIG. 8, the valve operation time increases and close time 312 far exceeds the step time 301 of process B, and time 304 in which the process gas (source gas) is supplied to the process furnace 40 is shorter than the above-described minimum time 303. This shows that the flowrate of the process gas (source gas) decreases and affects the thickness of film.

However, when the actual close time is between the close time 311 and the step time 301 of process B, the close time cannot be conventionally measured. Therefore, to actually detect the abnormality of the APC valve 242, the thickness of film of a sample wafer needs to be measured after processing (after completion of process). In this case, there is a possibility that the wafer 14 is processed in the next batch without noticing the valve operation abnormality.

Meanwhile, in the present embodiments, as illustrated in FIG. 5, the pressure control controller 212b is configured to report the acquired valve operation time (including the close time) of the APC valve 242 to the process control module 212. The process control module 212 is configured to confirm whether the acquired close time of the APC valve 242 exceeds the threshold value (time) T illustrated in FIG. 8, thereby detecting the valve operation abnormality in real time.

As described above, the process control module 212 can compare the acquired close time with the threshold value (time) while repeatedly acquiring the accurate close time of the APC valve 242 in real time during execution of the process recipe, thereby monitoring chronological behavior of data indicating operation delay time of the APC valve 242.

Further, since the threshold value T of the close time is set within the step time 301 of process B, for example, if the valve 61 for supplying the source gas is opened at the threshold value T, not only the process gas can be more efficiently filled in the process furnace 40 (process chamber 42) but also supply of the process gas can be stopped if abnormality occurs in the APC valve 242.

In the present embodiments, the degree of valve opening of the APC valve 242 is configured to maintain 0% during process C. However, the degree of valve opening of the APC valve 242 may be adjusted to keep a predetermined constant pressure in the interior of the process furnace 40 (process chamber 42). With the configuration, even in a process of repeatedly opening and closing the valve in a short time and supplying the process gas, the flowrate of the process gas flowing in the process furnace 40 can be stabilized.

According to the present embodiments, the accurate close time of the APC valve 242 can be monitored during execution of the process recipe, and for example, whether the APC valve 242 is approaching the state of affecting the thickness of film can be confirmed according to the opening and closing times of the APC valve 242 (particularly, the close time to full close). With the confirmation, the APC valve abnormality can be detected.

According to the present embodiments, the close time of the APC valve 242 is accumulated in the storage 222 of the main control module 201 or the host controller and displayed, whereby tendency of changing of the close time of the APC valve 242 can be monitored. For example, even in a process of repeatedly opening and closing the APC valve 242 in a short time and supplying the process gas to the process chamber, the amount of the process gas flowing in the process furnace is not changed, the influence on the thickness of film to be formed can be reduced.

Further, according to the present embodiments, if the time from the full open state to the full close state of the APC valve 242 is changed, the abnormality can be detected during execution of the process recipe (during the cyclic film formation), and measurement of the thickness of film of the sample wafer after completion of the process recipe, as in the conventional case, is not necessary. Therefore, reduction of maintenance time from error processing to restoration can be expected. Further, prevention of the next batch processing without noticing the abnormality of the thickness of film of the substrate can be controlled.

Furthermore, according to the present embodiments, in the process of repeatedly executing the process of supplying the process gas to the process chamber and the process of exhausting unreacted process gas from the process chamber in a short time, abrupt fluctuation of the gas flowing in the process furnace can be suppressed and the influence on the thickness of film to be formed can be reduced.

Further, according to the present embodiments, the main control module 201 or the host controller may be configured to detect the operation abnormality of the APC valve 242 by comparing the acquired close time with the threshold value, and display the abnormality information of the APC valve 242 on the display device 218. With such a configuration, even if abnormality occurs in the operation of the valve during the cyclic film formation, the valve operation abnormality in the film forming step (during execution of the recipe) can be detected. Therefore, performing the next batch processing without noticing the abnormality of the thickness of film of the substrate or measuring the thickness of film of the sample wafer after completion of the process recipe, as in the conventional case, are not performed and are not necessary. Therefore, reduction of maintenance time from error processing to restoration can be expected.

Further, the film forming step according to this present disclosure is not limited to the cyclic film formation of repeating process A and process C according to the thickness of film in the present embodiments, and can also be applied to cyclic film formation process of adding a process D of supplying the reactant gas into the process furnace 40 (process chamber 42) and setting process A, process C, process A, and process D as one cycle, and repeating the one cycle according to a target thickness of film. Further, the film forming step can also be applied to cyclic film formation of simply setting process C and process D as one cycle and repeating the one cycle according to a target thickness of film. Note that process B may be performed before process D or process B may be included in process D, as appropriate.

Further, as described above, the process furnace 40 according to this present disclosure is configured as a batch type device that processes a large number of wafers 14, for example. However, this present disclosure is not limited to the configuration and may be applied to a single sheet device that processes the wafers 14 sheet by sheet or to a multiple sheet device that processes the wafers 14 in every plurality of sheets.

For example, in the above-described embodiments, the case where the substrate to be processed is a semiconductor wafer substrate has been described as an example. However, this present disclosure is not limited to the example and can also be applied to a substrate processing apparatus that processes a glass substrate, such as a liquid crystal display (LCD) device.

Further, for example, in the above-described embodiments, this present disclosure is not limited to the embodiments. That is, another film forming processing may be processing of forming an oxide film and a nitride film or processing of forming a film containing metal may be adopted. Further, specific contents of the substrate processing are unmentioned, and furthermore, this present disclosure can also be suitably applied to other substrate processing apparatuses such as an oxidation processing apparatus, a nitriding processing apparatus, and a CVD apparatus using plasma.

According to this present disclosure, an accurate time to close a pressure control valve can be obtained.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus comprising:
   a controller configured to process a substrate by executing a process recipe for supplying at least a source gas to a process chamber to form a film on the substrate; and
   a pressure controller configured to control the degree of opening of a pressure control valve on the basis of a pressure value detected by a pressure sensor that detects a pressure in the process chamber, wherein the pressure controller includes a memory region in which data acquired from the pressure sensor and the pressure control valve is accumulated, and is configured to measure a valve full close time to full close of the pressure control valve during execution of the process recipe and hold the valve full close time in the memory region, and the controller is configured to acquire the valve full close time held in the memory region, and confirm whether the acquired valve full close time falls within a threshold range.

2. The substrate processing apparatus according to claim 1, wherein the controller is configured to execute the process recipe including supplying the source gas to the process chamber and exhausting the source gas from the process chamber.

3. The substrate processing apparatus according to claim 1, further comprising:

a main controller configured to cause the controller to execute the process recipe, wherein the controller is configured to report the valve full close time to the main controller at a predetermined cycle, and the main controller is configured to compare the valve full close time with a threshold value held in advance.

4. The substrate processing apparatus according to claim 3, further comprising:

a host controller connected to the main controller, wherein the main controller is configured to report the valve full close time acquired from the pressure controller to the host controller.

5. The substrate processing apparatus according to claim 4, wherein the host controller is provided at a position separated from the controller and the pressure controller.

6. The substrate processing apparatus according to claim 1, wherein the controller is configured to periodically output a data request instruction to the pressure controller.

7. The substrate processing apparatus according to claim 6, wherein the pressure controller is configured to report data including the pressure value detected by the pressure sensor and data of the degree of opening of the pressure control valve to the controller in addition to the valve full close time of the pressure control valve.

8. The substrate processing apparatus according to claim 6, wherein a data acquisition cycle of the pressure controller is set to be shorter than a data request instruction cycle of the controller.

9. The substrate processing apparatus according to claim 1, wherein the controller is configured to acquire a time to when the degree of opening of the pressure control valve becomes 0% from the pressure controller as the valve full close time.

10. The substrate processing apparatus according to claim 1, wherein the process recipe further includes a step of supplying the source gas, and the process recipe is configured to have a period in which at least the pressure control valve is fully closed during execution of the step of supplying the source gas.

11. The substrate processing apparatus according to claim 1, wherein the process recipe further includes a step of supplying the source gas, the step of supplying the source gas includes a step of fully closing the pressure control valve, and the threshold value is configured to be set to during a step time of the step of fully closing the pressure control valve.

12. The substrate processing apparatus according to claim 1, further comprising a valve configured to supply the source gas, wherein the valve is configured to be opened after the pressure control valve is fully closed.

13. The substrate processing apparatus according to claim 1, wherein the process recipe further includes a step of fully closing the pressure control valve before supplying the source gas, and the pressure control valve is configured to be fully closed during supply of the source gas.

14. A control system comprising:

a controller configured to process a substrate by executing a process recipe for supplying at least a source gas to a process chamber to form a film on the substrate; and a pressure controller configured to control the degree of opening of a pressure control valve on the basis of a pressure value detected by a pressure sensor that detects a pressure in the process chamber, wherein the pressure controller includes a memory region in which data acquired from the pressure sensor and the pressure control valve is accumulated, and is configured to measure a valve full close time to full close of the pressure control valve during execution of the process recipe and hold the valve full close time in the memory region, and the controller is configured to acquire the valve full close time held in the memory region, and confirm whether the acquired valve full close time falls within a threshold range.

* * * * *